United States Patent
May et al.

(10) Patent No.: US 7,224,560 B2
(45) Date of Patent: May 29, 2007

(54) DESTRUCTIVE ELECTRICAL TRANSIENT PROTECTION

(75) Inventors: James T. May, Tempe, AZ (US); Larry E. Tyler, Mesa, AZ (US)

(73) Assignee: Medtronic, Inc., Minneapolis, MN (US)

( * ) Notice: Subject to any disclaimer, the term of this patent is extended or adjusted under 35 U.S.C. 154(b) by 363 days.

(21) Appl. No.: 10/365,791

(22) Filed: Feb. 13, 2003

(65) Prior Publication Data

US 2004/0160717 A1    Aug. 19, 2004

(51) Int. Cl.
 *H02H 3/22* (2006.01)
(52) U.S. Cl. ......................................... 361/56; 361/111
(58) Field of Classification Search ................. 361/56, 361/57, 58, 91.1, 111
 See application file for complete search history.

(56) References Cited

U.S. PATENT DOCUMENTS

| 5,157,573 A | | 10/1992 | Lee et al. | |
| 5,255,146 A | * | 10/1993 | Miller | .......................... 361/56 |
| 5,477,413 A | | 12/1995 | Watt | |

(Continued)

FOREIGN PATENT DOCUMENTS

EP      0 851 552 A1    1/1998

WO      WO 01/97358    12/2001

OTHER PUBLICATIONS

Chen, J.Z. et al., "Design Methodology and Optimization of Gate-Driven NMOS ESD Protection Circuits in Submicron CMOS Processes," *IEEE Transactions on Electron Devices*, vol. 45, No. 12, p. 2448-2456 (Dec. 1998).

Polgreen, T.L. et al., "Improving the ESD Failure Threshold of Silicided n-MOS Output Transistors by Ensuring Uniform Current Flow," *IEEE Transactions on Electron Devices*, vol. 39, No. 2, p. 379-388 (Feb. 1992).

(Continued)

*Primary Examiner*—Brian Sircus
*Assistant Examiner*—Danny Nguyen
(74) *Attorney, Agent, or Firm*—Michael C. Soldner; Carol F. Barry; Girma Wolde-Michael

(57) ABSTRACT

A protection for ICs against ESD transients includes a circuit with a master circuit driving a slave circuit. The master circuit responds to ESD voltage V(t). The slave circuit comprises parallel shunt devices having common inputs. The output of the master circuit is coupled to the common inputs. As V(t) increases the master circuit applies a portion of V(t) to the input of the slave circuit shunt devices. The threshold voltage Vt1 at which the slave circuit shunt devices would otherwise turn on to a lower value Vt1' closer to the holding voltage Vh of the shunt devices. All of the slave circuit devices turn on substantially simultaneously at about Vt1' close to Vh, thereby shunting the ESD transient to ground at a lower value of V(t). The master and slave circuits are inactive during normal IC operation.

15 Claims, 3 Drawing Sheets

U.S. PATENT DOCUMENTS

| | | | |
|---|---|---|---|
| 5,978,192 A * | 11/1999 | Young et al. | 361/56 |
| 6,100,125 A | 8/2000 | Hulfachor et al. | |
| 6,249,410 B1 | 6/2001 | Ker et al. | 361/56 |
| 6,249,413 B1 * | 6/2001 | Duvvury | 361/111 |
| 6,583,972 B2 * | 6/2003 | Verhaege et al. | 361/56 |
| 6,775,112 B1 * | 8/2004 | Smith et al. | 361/18 |
| 7,072,161 B2 * | 7/2006 | Chen | 361/56 |
| 2002/0033507 A1 | 3/2002 | Verhaege et al. | |

OTHER PUBLICATIONS

Verhaege, et al., "Wafer Cost Reduction through Design of High Performance Fully Silicided ESD Devices", *EOS/ESD Symposium 00-18*, 2000, pp. 18-28.

Duvvury, Charvaka, et al., "Dynamic Gate Coupling of NMOS for Efficient Output ESD Protection", *Proceedings of the IRPS*, 1992, pp. 141-150.

* cited by examiner

DESTRUCTIVE ELECTRICAL TRANSIENT PROTECTION

FIELD OF THE INVENTION

The present invention generally relates to destructive transient suppression in semiconductor devices and circuits, and more particularly to electrostatic discharge protection for semiconductor devices and integrated circuits.

BACKGROUND OF THE INVENTION

Semiconductor devices and integrated circuits are prone to damage from high voltage transients. These transients may arise from electrostatic discharge (ESD) or from other causes, as for example, an electromagnetic pulse (EMP) caused by a nuclear explosion, lightning or other terrestrial, atmospheric or space electromagnetic event. As used herein, and not intended to be limiting, the term electrostatic discharge and the abbreviation ESD are intended to include all of the above and any other form of potentially destructive electrical transient to which a device or circuit may be exposed, irrespective of the physical origin of the transient. Also, for convenience of explanation and not intended to be limiting, as used herein the term integrated circuit and the abbreviation "IC" are intended to include individual semiconductor devices, interconnected arrays of semiconductor devices on a monolithic or other substrate, discrete devices and monolithic interconnected device arrays on a circuit module or circuit board or flexible circuit tape, and combinations thereof.

ESD is a very common phenomenon that often arises when ICs are stored, shipped, handled and used. For example, without being aware of it, a person about to handle or use an IC may become electrostatically charged. When such person touches the IC, this stored electrostatic energy may suddenly discharge through the device or circuit. Unless provision is made to absorb this ESD energy and limit the voltage appearing at the external or internal nodes of the IC, damage may result. It is not uncommon to encounter ESD voltages of $10^3$–$10^4$ volts whereas many ICs can be damaged by voltages of $10^2$ volts or less. Low voltage ICs with normal operating voltages of only a few volts are especially vulnerable.

It has been commonplace for many years to include ESD protection devices or circuits in ICs, especially ICs that employ field effect transistors (FETs), such as for example, MOSFET and JFET devices. MOSFET devices are further subdivided into NMOS and PMOS types and further sub-types and combinations such as CMOS. These terms and abbreviations are well known in the art. ESD protection devices are usually provided at the input/output (I/O) connection pads of the IC since these nodes are most likely to receive an ESD pulse, but they can also be provided anywhere within or external to the IC. As used herein, the terms "pad", "I/O pad" and "I/O node" are indented to include any node within or on an IC desired to be protected from ESD. The ESD protection device is typically coupled between the I/O node and ground or other reference voltage line or substrate. As used herein, the term "ground" is intended to include any line, rail, bus, substrate or other connection used as a reference level for the IC irrespective of its actual voltage level.

During normal circuit operation, the ESD device is inactive and does not interfere with normal circuit operation. But when the I/O node receives an ESD pulse, the ESD protection device turns on to limit the voltage that appears at the protected node and associated devices internal to the IC that are coupled to this node, and to harmlessly dissipate the energy of the ESD pulse. As soon as the ESD pulse has passed, the ESD protection device once again becomes inactive. Thus, the ESD device functions as a transient voltage clipper that limits the ESD voltage appearing on the I/O pads or other nodes of the IC to a safe level and that provides a harmless current path to ground or the like.

As IC technology has advanced and individual devices within the IC made faster and smaller, the ESD protection problem has been exacerbated. For example, the use of solicited contacts, very short channel lengths and decreasing source/drain gate contact spacing, has drastically reduced the ability of NMOS output devices to inherently provide ESD protection. Various solutions have been proposed in the prior art, for example: (1) Duvvury and Diaz in a paper entitled "*Dynamic Gate Coupling of NMOS for Efficient Output ESD Protection*" published in the Proceedings of the IRPS in 1992, pp 141–150, describe the use of gate coupling to improve ESD protection in silicided and LDD technology devices; (2) Verhaege and Russ in a paper entitled "*Wafer Cost Reduction through Design of High Performance Fully Silicided ESD Devices*" published in the EOS/ESD Symposium Proceedings in 2000, pp 18–28, describe a multi-finger turn-on technique coupled with the use of back-end ballast segmentation for improving ESD protection, and (3) Mergens et al in a paper entitled "*Multi-Finger Turn-on Circuits and Design Techniques for Enhanced ESD Performance with Width Scaling*" published in the EOS/ESD Symposium Proceedings in 2001, pp 1–11, describe both domino and multi-finger turn-on devices with merged ballasts.

In many of these approaches, output NMOS device 9 shown in FIG. 1 operates as parasitic bipolar NPN device with N-type drain 13 as collector, P-type body 17 as the base and N-type source 15 as the emitter. The body can be, for example, the substrate in a CMOS bulk process, the P-well of an epi process or a P-well isolated by an N-type tub as in a BiCmos process. FIG. 1 also shows current-voltage characteristic 10 of a device of this type. As the voltage V(t) across the source- source-drain terminals of the device increases it is triggered into conduction at voltage Vt1 and current It1. Vt1 is the collector-base breakdown voltage of the parasitic NPN with the base connected to the emitter through the p-type base body resistance. The current increases and the voltage drops to holding voltage Vh along path 11.

During the ESD event the device operates mostly in "snapback" region 11, 12. At higher stress levels, the device approaches second breakdown at voltage Vt2 and current It2. The voltage across the device then drops again and the current rises very rapidly along lines 14, 16, indicating that some form of catastrophic failure has occurred. With very low current devices, by the time the voltage has reached Vt2, some damage to the device may already have occurred resulting in increased leakage even if normal operation resumes.

The slope of snapback region 12 is the dynamic conductance, that is $(R-ON)^{-1}$. Generally, according to the prior art, to provide ESD protection while avoiding damage, the condition Vt2>Vt1 must be satisfied. It is common in the prior art to use multiple parallel devices, e.g., multi gate-finger NMOS output devices, that must all turn on in order to provide ESD protection and to employ ballast resistors for this purpose.

While these prior art approaches have been useful, they still suffer from a number of disadvantages well known in the art, as for example but not limited to some or all of: (i) use of breakdown induced ESD turn-on, (ii) larger than desired device and/or ballast resistor area, (iii) susceptibility to process fluctuations, (iv) poor turn-on efficiency, (v) higher than desired Vt1 and Vt2, and (vi) use of potentially destructive snap-back device functions and the like to trigger ESD protection. These disadvantages are particular troublesome with very low current devices where the increase in leakage currents that can result from dissipation of an ESD transient using prior art devices can cause circuit malfunction or loss of sensitivity when normal device operation resumes after the ESD transient has passed. Accordingly, there is an ongoing need for improved ESD means and methods for ICs, especially for ESD protection that allows Vh, Vt1 and Vt2 to be approximately equal, that has low ESD device propagation delay, that uses little chip area, that avoids the use of extra processing steps for silicide or LD blocks at the device, and that can handle very rapid rise time ESD pulses. Furthermore, other desirable features and characteristics of the present invention will become apparent from the subsequent detailed description of the invention and the appended claims, taken in conjunction with the accompanying drawings and this background of the invention.

BRIEF SUMMARY OF THE INVENTION

An apparatus is provided for protecting ICs against ESD transients. The apparatus comprises: a master circuit responsive to ESD voltage V(t) and having an output; and a slave circuit comprising multiple parallel shunt devices having a common input coupled to the output of the master circuit; wherein as V(t) increases the master circuit applies a portion of V(t) to the input of the slave circuit shunt devices thereby lowering a threshold voltage Vt1 at which the slave circuit shunt devices would otherwise turn on, to a smaller value Vt1' much closer to a holding voltage Vh of the shunt devices; and wherein when V(t) reaches Vt1', all of the slave circuit devices turn on substantially simultaneously, thereby shunting the ESD transient harmlessly to ground. The master circuit and slave circuits are desirably inactive during normal device operation.

A method is provided for harmlessly shunting a transient voltage V(t) appearing on a node of an IC to ground. The method comprises: dividing the transient voltage V(t) to obtain a reduced transient voltage Vmi; coupling the reduced voltage Vmi to a control terminal of an active device whose output terminal is coupled to a reference ground of the IC through a resistance, to produce an output voltage; substantially simultaneously coupling the output voltage to inputs of multiple parallel active devices whose power terminals are coupled between the node and the reference ground, wherein the output voltage reduces turn-on voltages of the multiple parallel active devices to a level sufficient to cause the multiple parallel devices to turn on substantially simultaneously, thereby clamping the transient voltage appearing at the node to a safe level.

BRIEF DESCRIPTION OF THE DRAWINGS

The present invention will hereinafter be described in conjunction with the following drawing figures, wherein like numerals denote like elements.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the invention.

Figure 2:
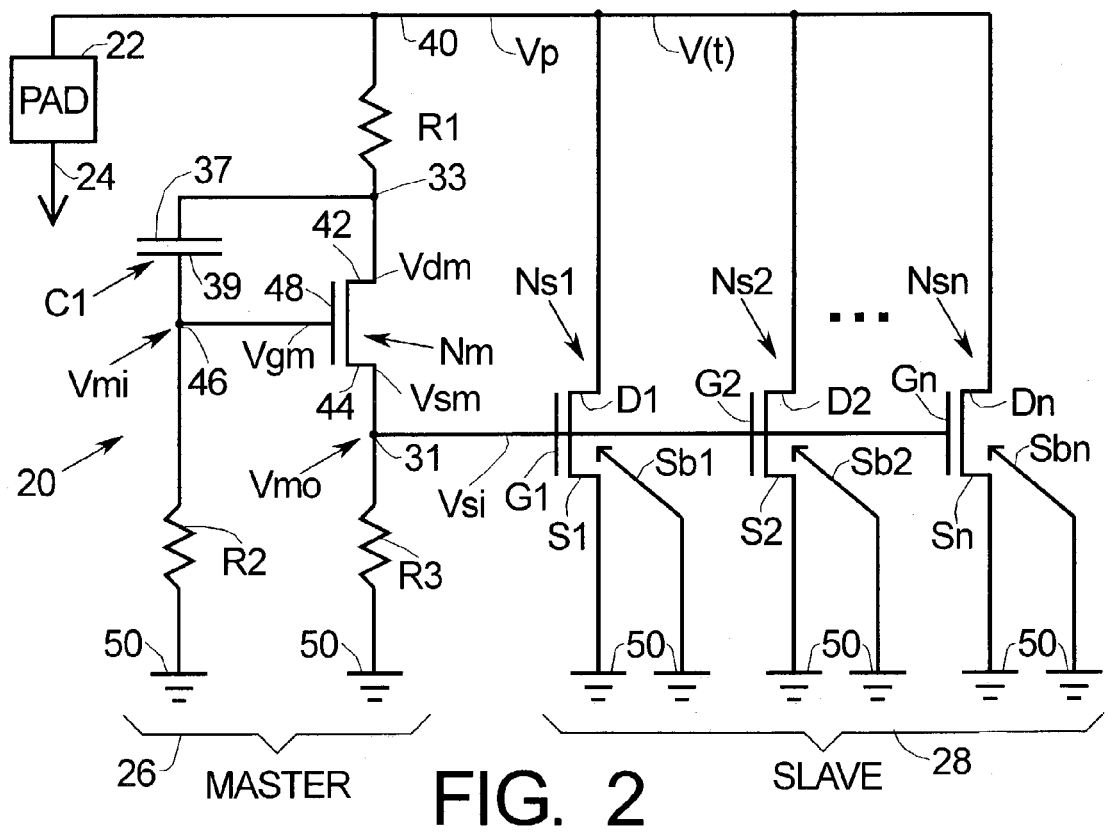
FIG. 2 is a simplified schematic diagram illustrating an ESD protection arrangement of the present invention according to a first embodiment.

FIG. 2 is a simplified schematic diagram illustrating ESD protection circuit 20 according to the present invention. Protection circuit 20 is coupled to bonding pad or other IC node 22, and to other portions of the IC as indicated by arrow 24. Circuit 20 comprises master circuit 26 coupled to slave circuit 28. Master circuit 26 comprises NMOS transistor Nm, Resistor R1, resistor R2, resistor R3 and capacitor C1. Resistor R1 is coupled between pad 22 and node 33, which is coupled to drain contact 42 of transistor Nm and to lead 37 of capacitor 38. Resistor R2 is coupled between node 46 and ground or other reference level 50. Node 46 is in turn is coupled to lead 39 of capacitor 38 and gate 48 of transistor Nm. Resistor R3 is coupled between source terminal 44 of transistor Nm at node 31 and ground 50. Node 31 is coupled to the control terminals G1, G2, . . . Gn of transistors Ns1, Ns2, . . . Nsn of slave circuit 28. Power terminals D1, D2 . . . Dn (e.g., drains) and S1, S2 . . . Sn (e.g., sources) of slave transistors Ns1, Ns2, . . . Nsn are coupled between line or rail 40 running to pad 22 and ground 50. Slave circuit 28 desirably comprises an n-fingered NMOS clamp device, with the multiple fingers creating parallel devices Ns1, Ns2, . . . Nsn. The ESD voltage appears on line 40 and needs to be harmlessly discharged to ground 50 without permitting damage to any devices or other portions of the IC coupled (as indicated by arrow 24) to pad 22.

When an ESD event occurs and the ESD voltage begins to appear on line or bus 40, master circuit 26 reacts quickly and turns on all parts of slave circuit 28 at substantially the same time, thereby clamping the voltage on line 40 and pad 22 to a safe level determined by holding voltage Vh of slave circuit devices Ns1 . . . Nsn, and any series resistance in the shunt path provided by slave circuit 28. This protects the remainder of the IC coupled to pad or node 22 via connection 24. It should be noted that device Nm is operating in a normal manner, that it, it is not required to go into any form of breakdown in order for slave circuit 28 to clamp and shunt the ESD pulse. Among other things, this provides very fast protection turn-on and makes the present invention much less susceptible to process fluctuations that can otherwise affect the breakdown characteristics of prior art ESD protection devices used without master circuit 26.

Resistors R1, R2 and capacitor C1 form an RC circuit across which appears the transient ESD pulse voltage Vp. It is desirable that resistors R1, R2 have relatively large values so that capacitor C1 can be made small and still provide an RC time constant that is in the appropriate range. R1, R2 are preferably about equal, as for example about 100,000 Ohms each, but larger or smaller values can also be used. Resistor R3 is preferable about 40% of R1, R2, for example, about 40,000 Ohms, but larger or smaller values can be also used. Methods for producing compact high value resistors for ICs are well known in the art. Capacitor C1 is desirably chosen so that time constant circuit of the master circuit is at least an order of magnitude larger than the time required for the slave device to enter full snapback. The time constant should be a balance between a) the rise time of digital inputs, b) the time for the slave device to enter full snapback, and c) the desired trigger voltage and could vary widely depending on technology and application. A value for C1 of about 0.1 picofarads is suitable but larger or smaller values can also be used.

Consider the situation when an ESD transient V(t) is applied to pad 22 and line 40 wherein the ESD pulse rises from V(t)=0 to about 7 volts in the first 0.1 nanoseconds. This is equivalent to a rise time about $7 \times 10^{10}$ volts per second, an extremely rapid rise time. Nonetheless, pulses with rise times of this magnitude can be encountered during ESD events.

Resistors R1 and R2 series coupled via capacitor C1 act as a transient voltage divider. Voltage Vgm appearing at gate 48, and voltage Vmi appearing on node 46 are the same. The transient voltage drop Vc(t) across C1 is about zero during the ESD pulse rise time because of the large dv/dt, so voltage Vdm appearing at drain 42 of master transistor Nm is about equal to Vmi and Vgm. R1 and R2 are conveniently about equal, so that Vmi at node 46 is about half the magnitude of voltage Vp on line 40. Thus, when voltage V(t) on pad 22 and line 40 reaches about V(t)=Vp=~7 volts Vmi=Vgm=Vdm are about 3.5 volts.

Master transistor Nm acts as a source follower so that voltage Vsm appearing at source 44 of master transistor Nm 30 and voltage Vsi at the input to slave circuit 28 are equal to Vgm−Vth, where Vth is the threshold voltage of transistor Nm, in this example about 0.5 volts. Thus, a voltage equal to about Vsi=Vp/2−Vth(Nm) (e.g., 7/2−0.5=~3 volts) appears at node 31 and on all of the gates or gate fingers of slave transistors Ns1, Ns2, . . . Nsn. The time delay is determined substantially by the switching time of Nm which is very fast, of the order of RC/10 to RC/100 seconds from when the ESD transient V(t) reaches the predetermined voltage V(t)=Vp. Thus, voltage Vsi=Vp/2−Vth(Nm) is applied substantially simultaneously to all of the gates G1, G2, . . . Gm of transistors Ns1, Ns2 . . . Nsn (collectively slave transistors 28) a very short time after the ESD pulse reaches the predetermined voltage Vp, about 7 volts in this example.

It is known that Vt1 is reduced by applying a voltage to gates G1, G2, . . . Gn of clamp devices Ns1, Ns2, . . . Nsn. This is used in the prior art by coupling the gates G1, G2, . . . Gn of the clamp devices Ns1 . . . Nsn to body 17 (FIG. 1) or to resistors placed in the source-ground lead of devices Ns1, Ns2, . . . Nsn (e.g., see slave circuit 28' in FIG. 4). With this prior art arrangement, that is, without master circuit 26, one of the multi-fingered devices (e.g., Ns1) must first trigger into snap-back at unmodified threshold Vt1 before there is a bias voltage available on the gates G2 . . . Gn of the remaining devices Ns2, . . . Nsn. Once a first clamp device has triggered at Vt1, then a voltage is available on the gates G2 . . . Gn. This lowers the threshold voltage Vt1 of the remaining clamp devices Ns2, . . . Nsn to a value below the ESD voltage V(t) so that remaining clamp devices Ns2 . . . Nsn all turn on together. A disadvantage of this prior art arrangement is that the snap-back transition of the first device does not occur until V(t) reaches unmodified threshold voltage Vt1, thus exposing the IC to a higher V(t). A further disadvantage is that the snap-back transition is relatively slow, thus the turn on of the remaining clamp devices Ns2 . . . Nsn is delayed by the turn-on time of the first clamp finger to fire (e.g., Ns1). With a very rapidly rising transient V(t) this can increase the stress to which the IC is exposed since the turn-on of the first finger may not provide sufficient clamping action to clip the rising V(t) transient.

The circuit of the present invention operates differently. All of the gates of the slave devices N1, N2, . . . Ns are driven by the output of master circuit 26. Thus, as soon as the voltage on node 46 rises above Vth(Nm), Nm begins to conduct, thereby raising Vsi applied to gates G1, G2, . . . Gn. Unlike the prior art, this occurs before V(t) reaches Vt1. Thus, with the present invention, all of clamp devices Ns1, Ns2, . . . Nsn turn on at the same time and at significantly lower values of V(t), e.g., at V(t)=Vt1'<<Vt1.

Vt1 decreases as Vsi increases. Vt1 usually has a minimum Vt1 (min) as a function of Vsi, often very near Vh. While the above noted values for R1, R2, R3 and C1 are convenient, larger and smaller values can be used depending on the value of V(t)=Vp at which clamping action is desired to be initiated. R1, R2, R3 be chosen so that when the ESD transient voltage V(t) applied to pad 22 and rail 40 reaches predetermined value V(t)=Vp, that Vsi=Vp/2−Vth(Nm) is sufficiently large to reduce Vt1 to about Vt1'=Vt1 (min), where Vt1 (min) is the minimum value of Vt1 as a function of gate voltage applied to clamp devices Ns1, Ns2, . . . Nsn, or stated alternatively to reduce Vt1' to be about Vt1'−Vh. The value of Vsi to accomplish this will vary with the technology used to construct devices Ns1, Ns2, . . . Ns but those of skill in the art will know how to determine the desired Vsi without undue experimentation.

Figure 1:
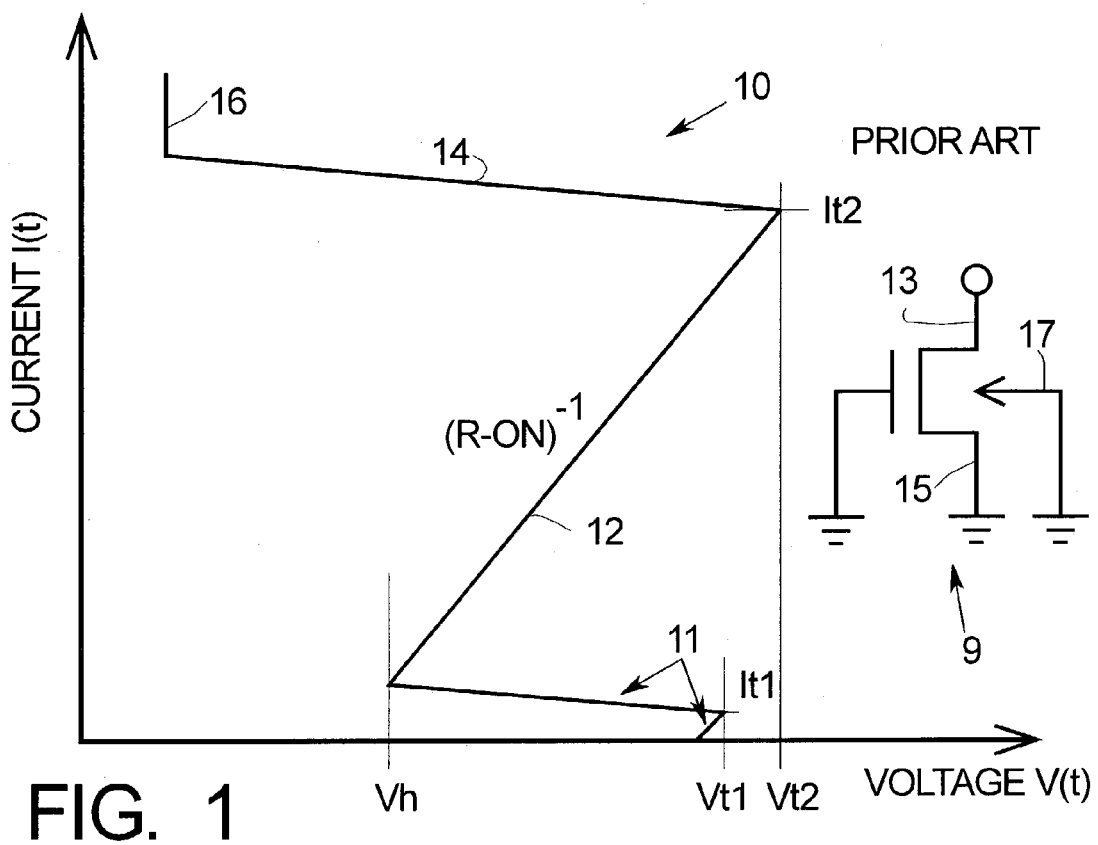
FIG. 1 shows the typical current voltage characteristics of a prior art parasitic NPN snapback type ESD protection device.
Figure 3:
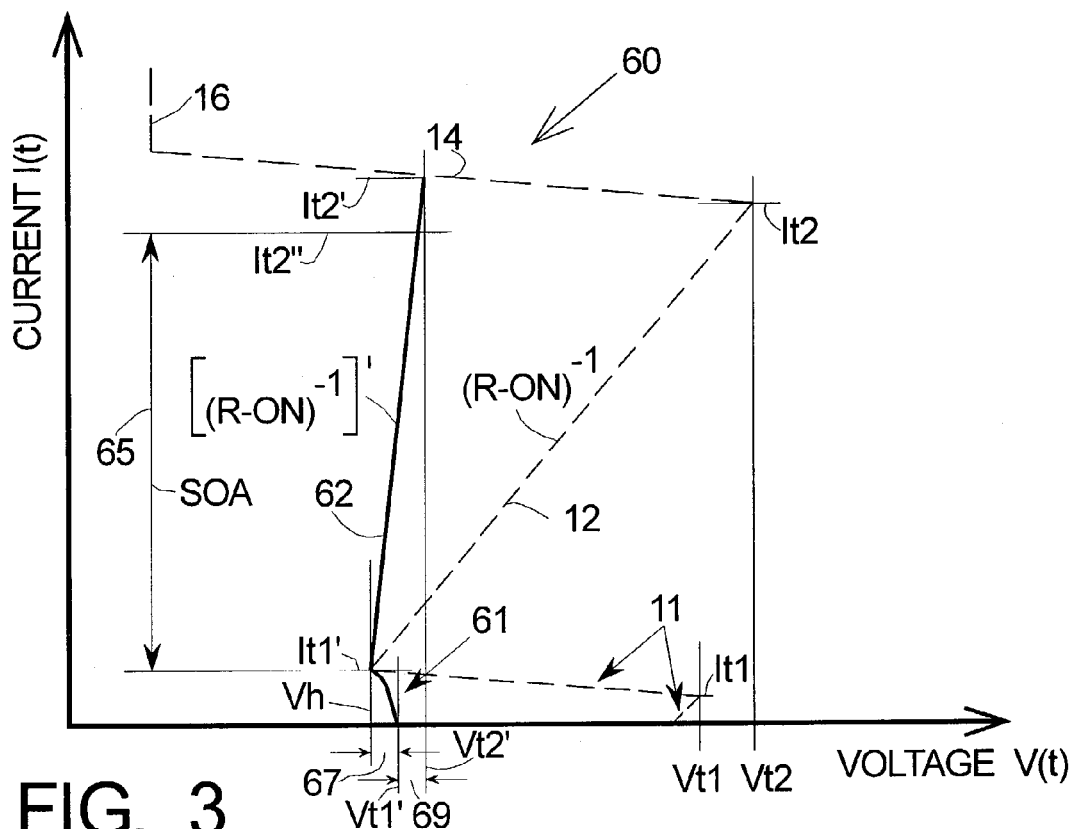
FIG. 3 shows current voltage characteristics of an ESD protection arrangement of the present invention, compared to the characteristic of FIG. 1.

FIG. 3 shows the current voltage properties 60 of circuit 20 of the present invention in response to such an ESD transient, in comparison to the characteristic shown in FIG. 1. The current—voltage characteristic of FIG. 1 is shown on FIG. 3 by dashed lines. Applying the voltage Vsi to gates G1, G2, . . . Gn of slave transistors 28 of the present invention has the effect of lowering the value Vt1 of the collector-base breakdown of the parasitic bipolar NPN transistors formed by drains D1, D2, . . . Dn as the collectors, sources S1, S2, . . . Sn as the emitters and substrates Sb1, Sb2, . . . Sbn as the base. Thus, with Vsi applied to gates G1, G2, . . . Gn, Vt1 drops to Vt1' and slave circuit 28 turns on along path 61. This occurs for all of slave transistors 28 substantially simultaneously, that is, they all turn on together. Thus, the clamp function provided by the multiple fingers of slave transistors 28 occurs substantially all at the same time. As noted above, this is in contrast to many prior art arrangements where at least one clamp transistor finger must reach collector breakdown threshold Vt1 before any Vt1 lowering action propagates to the other fingers.

As can be seen in FIG. 3, this modified value Vt1' obtained in the present invention is close to Vh, that is, off-set 67 between Vt1' and Vh is generally within about 20% of Vh, preferably as close as possible to Vh so that the clamping action is very efficient and very quick. As the ESD transient continues the slave circuit current rises along line 62 of FIG. 3. It will be noted that the dynamic conductance $[(R\text{-on})_2^{-1}]'$ of the present invention is much steeper than $(R\text{-on})^{-1}$ of the prior art arrangement illustrated by line 12 in FIG. 1 and FIG. 3. Thus, the clamping action of the present invention is very robust. It will also be noted that Vt2' is much lower than Vt2 of the unbiased transistors Ns1, Ns2, . . . Nsn and that Vt1', Vt2' and Vh are of similar magnitude. More specifically, offset 69 between Vt2' and Vt1' is generally within 20% of Vt1', more conveniently within about 10% of Vt1' and preferable within about 5% of Vt1', although larger and smaller values are useful. Vt2' can be made closer to Vh by increasing the number of fingers in the clamp devices Ns1, Ns2, . . . Nsn. Vt1' is a function of gate voltage, and process technology.

The steepness of region 62 can be adjusted by increasing or decreasing the number of fingers, that is, the number of parallel transistors in slave circuit 28. However, for the same number of fingers and active clamp device area, region 62 of the present invention will be steeper than region 12 of the prior art during the initial turn-on of the ESD clamp because all fingers become conductive at the same time. It is desirable to include a sufficient number of parallel fingers (transistors Ns . . . Nsn) so that the anticipated worst case ESD charge can be dissipated while remaining in safe operating area (SOA) 65 extending from It1' to It2'' where It2'' is less than It2'. It is desirable to derate the design maximum current density, It2'' by 25% from the measured value of It2' to ensure an adequate guard band. However, in cases where extremely low post-pulse leakage is required, It2'' must be de-rated by as much as 75 to 90% from It2'. This is to minimize the risk of partial damage to the IC as I(t) approaches It2' that might result in increased IC leakage once the ESD transient has passed.

The simultaneous finger turn-on provided by the present invention is superior to prior art approaches where the clamp device or finger turn-on is sequential (cascaded), that is, where one finger turns on and current flow through this first triggers another finger which in turn causes yet another finger to turn on and so forth. Each subsequent turn-on increases the current carrying capacity of the prior art clamp circuit. In other prior art, the first finger turns on, triggered at avalanche-dependent Vt1, which then fires all the other fingers simultaneously. However if the rise time of the ESD transient is very fast, the cascaded turn-on may not keep pace and less ESD protection is obtained or is undesirably rise-time sensitive. With the present invention, the high speed master circuit and the substantially simultaneous turn-on of the slave circuit transistors avoids this problem of the prior art. Even the so-called simultaneous turn-on approaches of the prior art require at least one finger to enter the snap-back mode at Vt1 in order to turn on other fingers at a reduced voltage less than Vt1. The present invention avoids this limitation.

A further advantage of the present invention is that it scales linearly, that is, the total current carrying capacity of the clamp circuit is proportional to the width of slave transistors 28, e.g., the number of parallel gate fingers. While this property is also possessed by some prior art arrangements, it is nonetheless an important feature that greatly facilitates design of ESD protection for different applications. An ESD protection solution that does not possess this property is less desirable.

A still further advantage of the present invention is that master circuit 26 with transistor Nm does not enter the snapback regime, that is, there is no risk of snapback or second breakdown in master stage 26. Resistor R3 decreases the voltage appearing across the source-drain and from the drain to body of transistor Nm preventing it from entering the snapback mode. This is an important advantage since having any transistor enter the snap-back mode at large values of Vt1 increases the risk that some partial damage will occur and parasitic leakage will increase after the ESD transient has passed. This is especially important in very low voltage ICs designed for low power applications where low parasitic leakage is a significant design objective. A further advantage of avoiding snapback in the master stage is that snapback is relative slow process since the time required to enter full snapback depends on the base transit time of the parasitic NPN transistor. Accordingly, master circuit 26 operates much faster than if it depended on snap-back for triggering slave devices 28, 28'.

Figure 4:
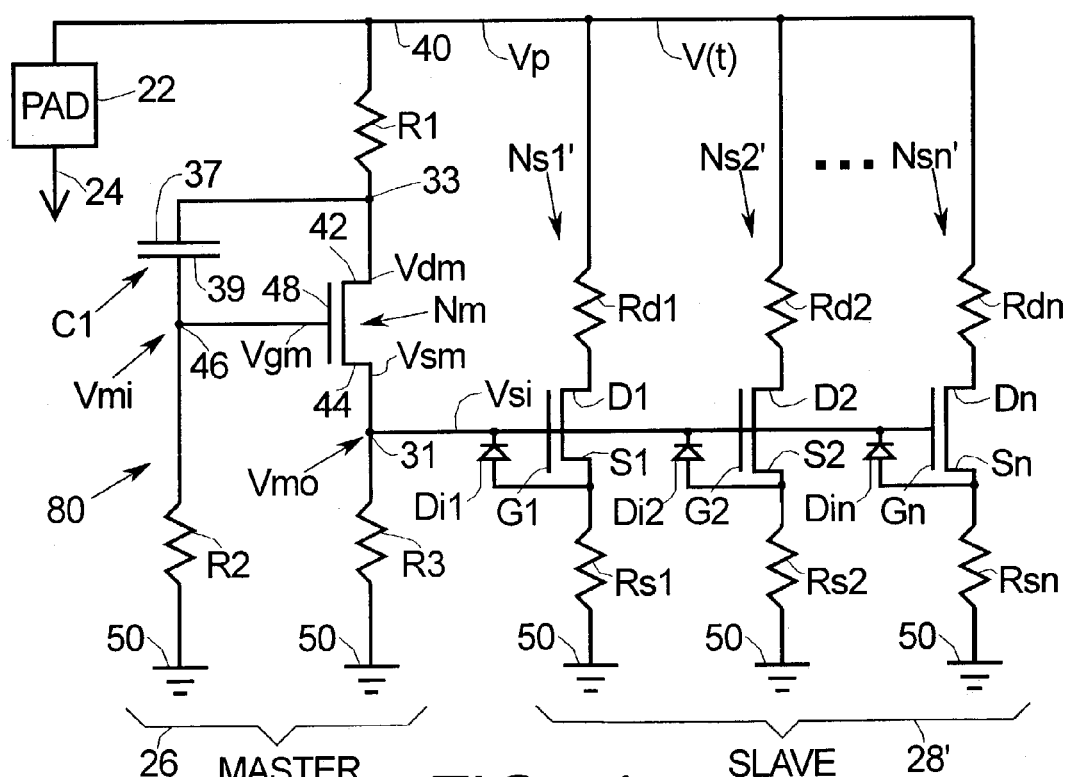
FIG. 4 is a simplified schematic diagram illustrating an ESD protection arrangement of the present invention according to a further embodiment.

FIG. 4 is a simplified schematic diagram illustrating ESD protection arrangement 80 according to a further embodiment of the present invention. Substrate diodes Sb1, Sb2 . . . Sbn are not shown in FIGS. 4–5 for simplicity and convenience of explanation, but persons of skill in the art will understand that they are present. Circuit 80 of FIG. 4 differs from circuit 20 of FIG. 2 in that series drain resistances Rd1, Rd2, . . . Rdn and series source resistances Rs1, Rs2, . . . Rsn are included in slave circuit 28'. Convenient values for these resistances are of the order of $10^0$ to $10^2$ Ohms with about 5 ohms being preferred, but larger or smaller values can also be used. These resistances are useful in equalizing current flow through multiple transistors Ns1, Ns2, . . . Nsn during the ESD event when in conduction regions 61, 62 of FIG. 3. Diodes Di1, Di2, . . . Din are desirably coupled between sources S1, S2, . . . Sn and gates G1, G2, . . . Gn of transistors Ns1, Ns2, . . . N2n, respectively. In the event that master circuit 26 fails to operate for some unexpected reason, for example when transistor Nm has a hidden manufacturing defect, then diodes Di1, Di2, . . . Din will cause transistors Ns1, Ns2, . . . Nsn to turn on in the same way as described in the prior art. Thus diodes Di1, Di2, . . . Din act to increase the overall robustness of the protection circuit of the present invention by providing a fail-safe mode of operation.

Figure 5:
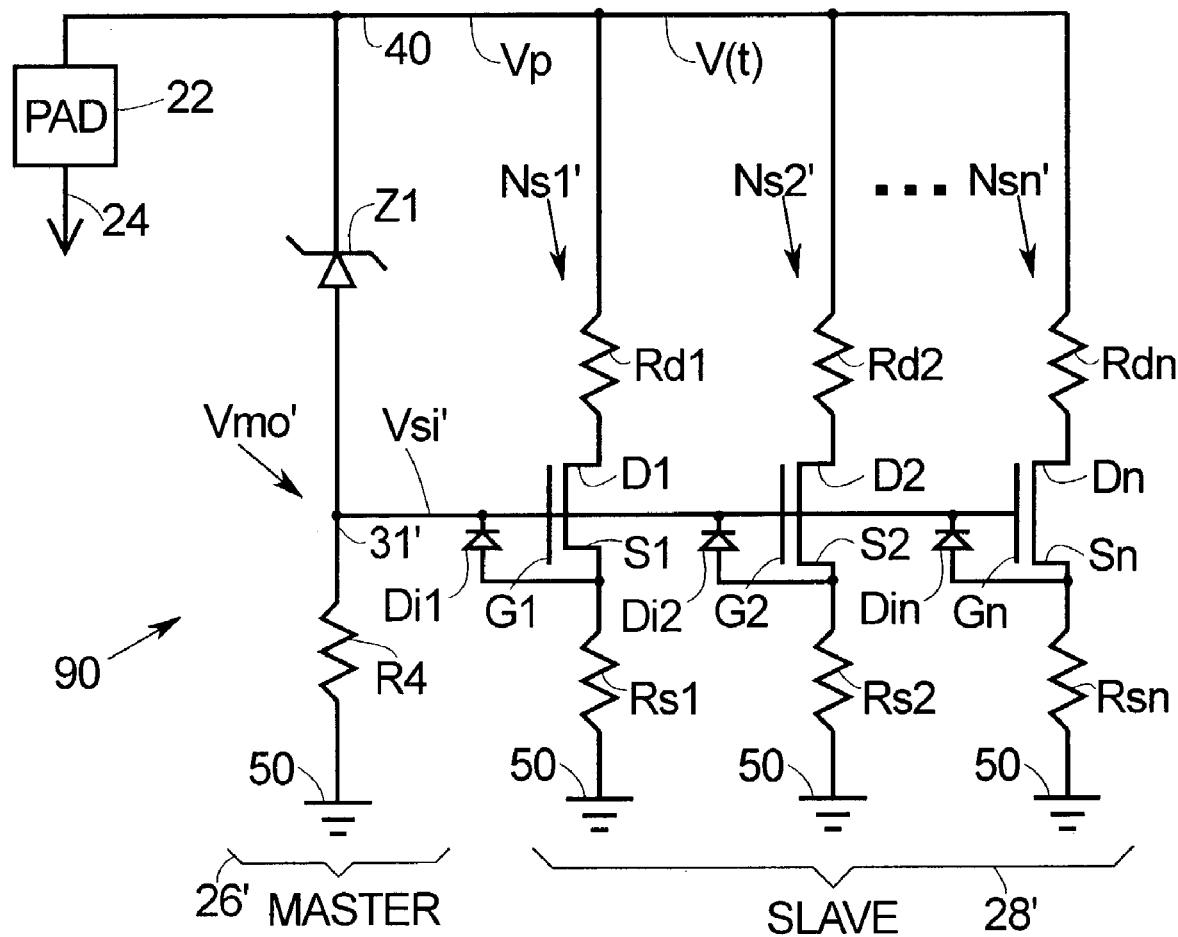
FIG. 5 is a simplified schematic diagram illustrating an ESD suppression arrangement according to a still further embodiment of the present invention.

FIG. 5 is a simplified schematic diagram illustrating ESD suppression circuit 90 according to a still further embodiment of the present invention. The circuit of FIG. 5 has slave portion 28' like slave portion 28' of FIG. 4, but slave portion 28 of FIG. 2 could equally well be used. Master portion 26' of FIG. 5 shows a further embodiment in which master portion 26 of FIG. 2 is replaced by master portion 26'. In master portion 26', Vmo is generated from V(t)=Vp by means of Zener diode Z1 and resistor R4 series coupled between rail 40 and ground 50. Node 31' at the junction of between Zener Z1 and resistor R4 and is coupled to gates G1, G2, . . . Gn of slave transistors Ns1', Ns2' . . . Nsn'. Slave portion 28, 28' in FIG. 5 functions in the same manner as slave portions 28, 28' in FIGS. 2, 4 respectively.

As the ESD generated voltage V(t) rises, node 31' remains substantially at ground until Zener Z1 fires at V(t)=Vp. The voltage Vmo appearing on node 31' is determined by the combination of the Zener voltage of Z1, resistor R4 and voltage Vp. The use of a zener rather than a MOSFET in master circuit 26' can shorten the time required to produce voltage Vmo. It is desirable to choose Z1 and R4 so that when V(t) reaches the level Vp at which it should be clamped, Vmo is sufficient to reduce Vt1 of transistors Ns1, Ns2, . . . Nsn to Vt1' in much the same way as described in connection with circuits 20, 80 of FIGS. 2, 4. For example, assume that it is desired that ESD protection transistors 28, 28' fire when V(t)=Vp=about 7 volts, then Z1 and R4 are chosen so that Vmo' about equals Vt1' the voltage necessary to reduce Vt1' to about its minimum value for the transistors of slave circuit 28, 28'. For the example where Vp=~7 volts, this is about Vmo'=2 to 3 volts and, correspondingly, Z1 is chosen to have a Zener voltage of about 4 to 5 volts. R4 is chosen to limit the current through master circuit 26' to a sustainable level during the ESD pulse. The Zener voltage needs to be above the normal working voltage of the IC that appears on pad 22 and rail 40 so that master circuit 26' remains substantially inactive during normal IC operation.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention. It being understood that various changes may be made in the function and arrangement of elements described in an exemplary embodiment without departing from the scope of the invention as set forth in the appended claims.

What is claimed is:

1. A circuit for protecting an Integrated Circuit (IC) against an ElectroStatic Discharge (ESD) transient, the circuit comprising:
    a master circuit responsive to an ESD voltage V(t) and having an output; and
    a slave circuit comprising multiple parallel shunt devices having a common input coupled to the output of the master circuit; wherein
    as V(t) increases the master circuit applies a portion of V(t) to the input of the multiple parallel shunt devices thereby lowering a threshold voltage Vt1 at which the multiple parallel shunt devices would otherwise turn on, to a smaller value Vt1' much closer to a holding voltage Vh of the multiple parallel shunt devices;
    wherein when V(t) reaches VT1', all of the multiple parallel shunt devices turn on substantially simultaneously, thereby shunting the ESD transient harmlessly to ground,
    wherein the master circuit comprises a transient voltage divider having a first resistor R1, a capacitor C1 and a second resistor R2 series coupled between V(t) and ground, and an active device having a control terminal T1 and power terminals T2, T3, wherein T1 is coupled to a first terminal of C1, a second terminal of C1 is coupled through R1 to V(t), T1 is coupled to a first terminal of R2, a second terminal of R2 is coupled to ground, T2 is coupled to the second terminal of C1 and through R1 to V(t), and T3 is coupled through a third resistor R3 to ground, wherein the output of the master circuit is derived from T3.

2. The circuit of claim 1 wherein the master circuit comprises a transient voltage divider having a time constant at least 5 times the ESD transient rise time to Vt1'.

3. The circuit of claim 1 wherein R1, R2 and C1 are chosen so that during the time wherein the ESD transient rises to about Vt1', there is negligible voltage drop across C1.

4. The circuit of claim 1 wherein the portion of V(t) applied to the input of the slave circuit shunt devices is sufficient to reduce Vt1 to approximately its minimum value Vt1'.

5. The circuit of claim 1 wherein the parallel shunt devices are NMOS devices and the portion of V(t) applied to gate inputs of the NMOS devices is a voltage that minimizes Vt1'.

6. The circuit of claim 1 wherein the multiple parallel shunt devices comprise NMOS transistors having gates coupled to the slave circuit input, collectors coupled to V(t) and sources coupled to a ground potential, and further comprising parasitic NPN bipolar transistors formed by the NMOS drains acting as collectors and a P substrate or well regions of the NMOS transistor acting as bases and the NMOS sources acting as emitters, whereby Vt1 and Vt1' are the collector-base breakdown voltages of the parasitic NPN transistors respectively without and with bias applied to the NMOS gates, wherein Vt1'<Vt1.

7. The circuit of claim 1 wherein Vt1' is within 20% of Vh.

8. The circuit of claim 2 wherein R1 and R2 are substantially equal.

9. A method for harmlessly clamping a transient voltage V(t) appearing on a node of an IC, comprising:
    dividing the transient voltage V(t) via a transient voltage divider to obtain a reduced transient voltage Vmi, the transient voltage divider having a first resistor R1, a capacitor C1 and a second resistor R2 series coupled between V(t) and a reference ground;
    coupling the reduced transient voltage Vmi to a control terminal of an active device to produce an output voltage Vmo at an output terminal of the active device, the output terminal coupled to the reference ground of the IC through a third resistor R3; and
    substantially simultaneously coupling the output voltage Vmo to inputs of multiple parallel active devices whose power terminals are coupled between the node and the reference ground, wherein the output voltage Vmo is sufficient to reduce turn-on voltages of the multiple parallel active devices to a level sufficient to cause the multiple parallel active devices to turn on substantially simultaneously at substantially voltage V(t), thereby clamping the transient voltage appearing at the node to a safe level.

10. The method of claim 9 wherein in the first coupling step comprises, coupling the reduced voltage to a control terminal of an active device whose output terminal is coupled to the reference ground of the IC through a resistor to produce an output voltage about a threshold voltage less than the reduced voltage.

11. The method of claim 9 wherein the dividing step and the first coupling step comprise, reducing the transient voltage by a Zener diode generated voltage to obtain an output voltage Vmo less than the transient voltage V(t).

12. The method of claim 9 further comprising, providing a guard band wherein the multiple parallel devices provide sufficient current carrying capacity to prevent occurrence of increased leakage in the IC after the ESD transient has passed.

13. A circuit for protecting a node of an IC against an ESD transient rising to a voltage V(t) by substantially shunting the ESD transient to ground, the circuit comprising:
    a master circuit responsive to V(t), the master circuit including a transistor operable to produce a voltage Vmo at an output terminal of the transistor that is less than V(t) without triggering a breakdown in any component of the master circuit, the master circuit further including a voltage divider operable to divide the voltage V(t) to produce a divided voltage at an input terminal of the transistor, the voltage divider having a capacitor C1 and at least two resistors, the at least two resistors including a first resistor R1 and a second resistor R2, the first resistor R1, the capacitor C1, and the second resistor R2 series coupled between the node and ground; and
    a slave circuit comprising multiple parallel devices having power terminals coupled between the node and ground, and wherein the multiple parallel devices have common input terminals for receiving the voltage Vmo, the voltage Vmo being substantially simultaneously applied to all of the common input terminals, wherein the voltage Vmo acting at the common input terminals reduces a breakdown voltage of at least one of the power terminals of each of the multiple parallel devices to a value less than or equal to the ESD voltage V(t), thereby causing the power terminals to become conductive substantially simultaneously and shunt the ESD transient to ground.

14. The device of claim 13 wherein the voltage Vmo comprises a voltage that minimizes the breakdown voltage.

15. The device of claim 13 wherein a sum of the resistances of the at least two resistors is equal to R, wherein a capacitance of the capacitor C1 is equal to C, and wherein a product RC is such that the during the ESD transient rise time to V(t), there is negligible voltage drop across the capacitor C1.

* * * * *